United States Patent
Kobayashi

(10) Patent No.: US 9,640,727 B2
(45) Date of Patent: May 2, 2017

(54) LIGHT EMITTING DEVICE

(71) Applicant: NICHIA CORPORATION, Anan-shi, Tokushima (JP)

(72) Inventor: Hiroshi Kobayashi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 14/976,611

(22) Filed: Dec. 21, 2015

(65) Prior Publication Data
US 2016/0190402 A1    Jun. 30, 2016

(30) Foreign Application Priority Data

Dec. 26, 2014  (JP) .................................. 2014-266741

(51) Int. Cl.
| | |
|---|---|
| *H01L 33/38* | (2010.01) |
| *H01L 33/50* | (2010.01) |
| *H01L 33/36* | (2010.01) |
| *H01L 23/544* | (2006.01) |
| *H01L 33/62* | (2010.01) |
| *H01L 33/60* | (2010.01) |
| *H01L 25/16* | (2006.01) |

(Continued)

(52) U.S. Cl.
CPC ............ *H01L 33/38* (2013.01); *H01L 23/544* (2013.01); *H01L 33/36* (2013.01); *H01L 33/507* (2013.01); *H01L 33/62* (2013.01); *H01L 25/167* (2013.01); *H01L 33/486* (2013.01); *H01L 33/54* (2013.01); *H01L 33/60* (2013.01); *H01L 2223/5442* (2013.01); *H01L 2223/54426* (2013.01); *H01L 2223/54486* (2013.01); *H01L 2933/0041* (2013.01)

(58) Field of Classification Search
CPC ....... H01L 33/36; H01L 33/38; H01L 33/507; H01L 33/60; H01L 2933/0041
See application file for complete search history.

(56) References Cited

U.S. PATENT DOCUMENTS

| | | | |
|---|---|---|---|
| 2002/0187571 A1 | 12/2002 | Collins, III et al. | |
| 2012/0248483 A1* | 10/2012 | Beppu ................... | H01L 33/505 257/98 |

(Continued)

FOREIGN PATENT DOCUMENTS

| | | |
|---|---|---|
| JP | 2003-069086 A | 3/2003 |
| JP | 2005-051184 A | 2/2005 |

(Continued)

*Primary Examiner* — Fei Fei Yeung Lopez
(74) *Attorney, Agent, or Firm* — Global IP Counselors, LLP

(57) ABSTRACT

A light emitting device includes a light emitting element having electrodes, a support, at least one pair of conductive wires that are formed on a surface of the support with a space from each other, and on which the electrodes of the light emitting element are disposed, distance between the pair of conductive wires under an outer edge of the light emitting element being shorter than the distance between the pair of conductive wires at other portions under the light emitting element, and a phosphor layer that continuously covers the outer edge of the light emitting element and a surface of the conductive wires around a region where the light emitting element is disposed.

11 Claims, 3 Drawing Sheets

(51) Int. Cl.
    *H01L 33/48*     (2010.01)
    *H01L 33/54*     (2010.01)

(56)     References Cited

U.S. PATENT DOCUMENTS

| | | | |
|---|---|---|---|
| 2013/0001618 A1* | 1/2013 | Imai | H01L 33/486 |
| | | | 257/98 |
| 2013/0169149 A1 | 7/2013 | Sato et al. | |
| 2014/0021506 A1 | 1/2014 | Yamada | |
| 2014/0346548 A1 | 11/2014 | Beppu et al. | |

FOREIGN PATENT DOCUMENTS

| | | |
|---|---|---|
| JP | 2012-089728 A | 5/2012 |
| JP | 2012-256848 A | 12/2012 |
| JP | 2014-022581 A | 2/2014 |
| WO | 2012-029695 A1 | 3/2012 |

* cited by examiner

LIGHT EMITTING DEVICE

CROSS-REFERENCE TO RELATED APPLICATIONS

This application claims priority to Japanese Patent Application No. 2014-266741 filed on Dec. 26, 2014. The entire disclosures of Japanese Patent Application No. 2014-266741 are hereby incorporated herein by reference.

BACKGROUND

1. Technical Field

The present disclosure relates to a light emitting device.

2. Description of Related Art

A light emitting device in which a light emitting diode (LED) or other such light emitting element is used is generally made up of light emitting elements, protective elements, and other such electronic parts, a substrate on which these are disposed, and a light-transmissive resin for protecting the light emitting elements, protective elements, and so forth.

With a known method for making a light emitting device, which emits white light, part of the blue light outputted from the light emitting element undergoes wavelength conversion by a phosphor, and white light is emitted by mixing the yellow light produced by this wavelength conversion and the blue light from the light emitting element. JP2003-69086A discloses that a phosphor layer with a uniform thickness is formed on the light emitting element by using a method called electrodeposition. With a light emitting device in which a phosphor layer has been formed by electrodeposition, the phosphor layer can be formed extremely close to the light emitting element, so light distribution characteristics close to those of a point light source can be obtained. Advantages of a point light source are that the emission surface area is small, making it is easier to design the products into which this light source is incorporated. As such, these light sources are expected to find use in many different fields, such as the field of lighting.

The above-mentioned electrodeposition deposits phosphor particles on the surface of the light emitting element by generating an electric field in a solution containing the phosphor particles. The conductive wires exposed around the light emitting element are also covered by the phosphor particles. However, the support (i.e., an insulating material) is exposed between a pair of conductive wires located on the lower side of the outer edge of the light emitting element, so there is the risk that the phosphor particles are not electrodeposited there, and this location will not be covered by the phosphor layer. If not covered by the phosphor layer, this part are not excited by the phosphor, so the blue light outputted from the light emitting element may be more intense, in which case uniform emission may not be obtained. In view of this, there has been a need for a light emitting device with which more uniform light emission can be obtained.

SUMMARY

A light emitting device of the present disclosure includes: a light emitting element having electrodes, a support, at least one pair of conductive wires that are formed on a surface of the support with a space from each other, and on which the electrodes of the light emitting element are disposed, of distance between the pair of conductive wires located under the light emitting element, distance between the pair of conductive wires located on a lower side of an outer edge of the light emitting element being the shortest, and a phosphor layer that continuously covers an outer edge of the light emitting element, and a surface of the conductive wires around a region where the light emitting element is disposed.

In an embodiment according to the disclosure, of a pair of conductive wires disposed on the lower side of a light emitting element, the area between a pair of conductive wires located on the lower side on the outer edge of the light emitting element, which affects on uniform light emission, can be easily covered by the phosphor layer. It is therefore possible to obtain more uniform light emission.

DETAILED DESCRIPTION OF THE EMBODIMENTS

Embodiment 1

Figure 1:
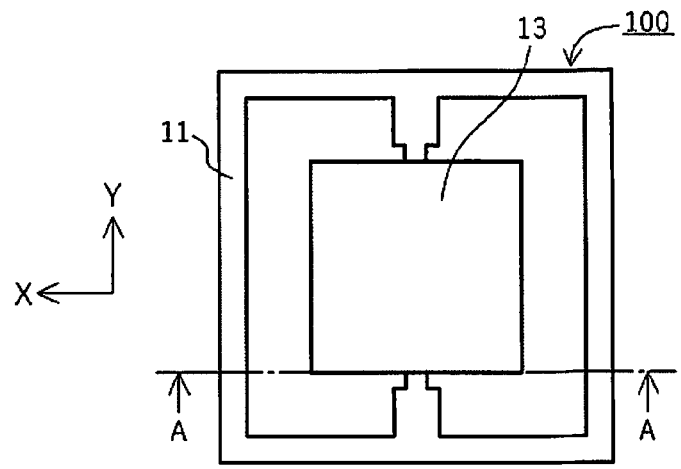
FIG. 1 is a schematic plan view of the light emitting device according to Embodiment 1.
Figure 2:
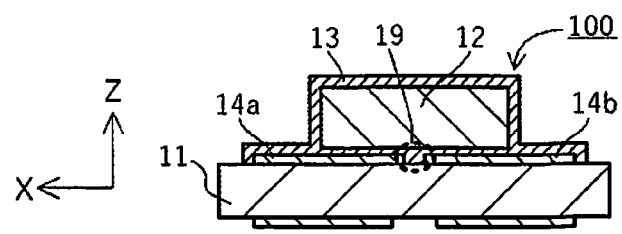
FIG. 2 is a schematic cross section along the A-A line in FIG. 1.
Figure 3:
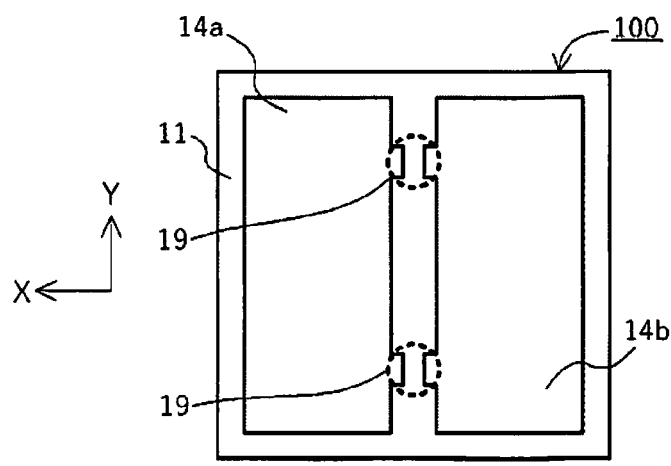
FIG. 3 is a schematic plan view of the conductive wires and support of the light emitting device shown in FIG. 1.

FIG. 1 is a schematic plan view of the light emitting device according to Embodiment 1. FIG. 2 is a schematic cross section along the A-A line in FIG. 1. FIG. 3 is a schematic plan view of the conductive wires and support of the light emitting device shown in FIG. 1. As shown in FIGS. 1 to 3, the light emitting device 100 according to Embodiment 1 has a support 11, at least one pair of conductive wires 14a and 14b formed on the surface of the support, a light emitting element 12 having electrodes, and a phosphor layer 13. The one or more pairs of conductive wires 14a and 14b are formed with a space from each other. The electrodes of the light emitting element 12 are disposed on the conductive wires. The phosphor layer 13 continuously covers the outer edge of the light emitting element, and the surface of the conductive wires around the region where the light emitting element is disposed. With this light emitting device, of the distance between the pair of conductive wires located on the lower side of the light emitting element, the distance between the pair of conductive wires 19 located on the lower side on the outer edge of the light emitting element is the shortest. This is described in detail below.

Support 11

The support 11 is used to dispose the light emitting element 12, a protective element 16 (see FIG. 4 as discussed below), and other such electronic parts. There are no particular restrictions on the support 11, but it preferably has an upper surface that is flat, such as one in the form of a rectangular plate. The support 11 is an insulating member, and is made of glass epoxy resin, a thermoplastic resin, or the like, and preferably of a ceramic such as alumina or aluminum nitride.

Conductive Wires 14a and 14b

The conductive wires 14a and 14b are formed on the support 11, and are used to electrically connect the light emitting element 12 disposed on the support 11 to an external power supply, and to apply voltage from the external power supply to the light emitting element 12. In this embodiment, the conductive wires 14a and 14b are partially embedded in the support 11, and are exposed at the upper and lower surfaces of the support 11. This allows the conductive wires of the upper and lower surfaces to be electrically connected, and allows electricity to be conducted from the rear surface side of the support 11 to the light emitting element 12.

The light emitting element 12 is mounted on the conductive wires 14a and 14b. The conductive wires 14a and 14b are preferably formed on a wide area around the light emitting element 12 so that heat produced by the light emitting element 12 may be efficiently dissipated through the conductive wires 14a and 14b. It is also preferable for the phosphor layer 13, a light-reflective layer 17 (see FIGS. 4 to 7; discussed below), or the like to be formed by electrodeposition on the surface of the conductive wires 14a and 14b provided around the light emitting element 12. The phosphor layer 13 and the light-reflective layer 17 can be formed in a uniform thickness by employing electrodeposition method. However, in the case where the phosphor layer 13 is formed by electrodeposition, it will be difficult to form the phosphor layer 13 on the support 11 of an insulating material. The phosphor layer 13 is formed by depositing phosphor particles on a conductive material. When the phosphor particles are deposited, they are deposited not only in a z direction of the phosphor layer 13, but also in a x and y directions of the phosphor layer 13. This allows the phosphor particles deposited in x and y directions to cover the support 11 of an insulating material. However, in the case where the conductive wires are spaced far apart, or in the case where the phosphor layer 13 which is formed by particle deposition is thin, it may be difficult to cover the space between the conductive wires with the phosphor layer 13. In view of this, the distance between the conductive wires can be reduced so that the phosphor layer 13 formed on the conductive wires 14a and 14b are more likely to be linked up on the support 11 of an insulating material. However, since the polarity during electrically drive will be different when the entire distance between the pair of conductive wires is reduced, there is a risk that the conductive wires 14a and 14b are end up linking together and cause a short circuit. In view of this, as shown in FIGS. 1 to 3, in the case where the distance is reduced between the pair of conductive wires 19 located on the lower side on the outer edge of the light emitting element, they can be covered by the phosphor layer 13 while making the light emitting device less likely to suffer a short circuit. It is also preferable for the distance between the pair of conductive wires 19 located on the lower side on the outer edge of the light emitting element to be the shortest distance between the conductive wires, again to avoid short circuiting. Increasing the thickness in which the phosphor layer 13 is deposited also makes it easier for the phosphor layer 13 to cover the space between the pair of conductive wires 19 located on the lower side on the outer edge of the light emitting element. However, since making the phosphor layer 13 thicker runs a risk of leading to color unevenness or a drop in output, it is preferably to reduce the distance between the conductive wires.

There are no particular restrictions on the distance between the pair of conductive wires 19 located on the lower side on the outer edge of the light emitting element, but narrower is preferable in order to make it easier to cover with the phosphor layer 13, and more specifically between 0.02 and 0.08 mm is preferable, between 0.02 and 0.05 mm being more preferable, and between 0.02 and 0.04 mm being still more preferable. Also, the distance between the pair of conductive wires 19 located on the lower side on the outer edge of the light emitting element is preferably 1.5 to 30 times the average particle size of the phosphor as discussed below, and more preferably 2 to 15 times.

The conductive wires 14a and 14b should be made of a material that is electrically conductive, but are preferably made of a material that is physically and chemically stable.

More specifically, the conductive wires 14a and 14b can be formed of copper, aluminum, gold, silver, tungsten, iron, nickel, or another such metal, or of an iron-nickel alloy, phosphor bronze, or another such alloy, etc.

Also, the surface of the conductive wires 14a and 14b is preferably covered by a material with high reflectivity, such as silver or gold, in order to extract the light efficiently from the light emitting element 12 mounted on them. In an embodiment according to the disclosure, as shown in FIG. 1, the surface area of the conductive wires 14a and 14b located around the lower side on the outer edge of the light emitting element 12 is large, so in the case where the conductive wires 14a and 14b have higher reflectivity than the support 11, this also leads to higher output.

Also, the conductive wires 14a and 14b may be bent or distorted on the support surface or in its interior.

here are no particular restrictions on the thickness of the conductive wires 14a and 14b, but thicker is preferable in terms of enhance heat dissipation, and more specifically a thickness of about 5 to 80 µm is preferable.

When a ceramic is used as the support 11, the support 11 can be produced by either post-firing or co-firing. Post-firing is a method in which the conductive wires 14a and 14b are formed on a large-diameter ceramic plate that has already been fired. Co-firing, meanwhile, is a method in which the conductive wires 14a and 14b and the ceramic plate are fired at the same time. A ceramic plate is manufactured by firing a sheet of a ceramic precursor called a green sheet, but the plate shrinks when fired. The dimensions of the green sheet are designed to take into account this shrinkage during firing, but dimensional accuracy after firing is inferior to that of the post-firing method. Accordingly, in forming a light-transmissive part 18 as shown in FIGS. 4 to 7 (Embodiment 2 as discussed below) on the support 11, a problem is that the dimensions of the ceramic and the mold for the light-transmissive part 18 do not match, and the position of the light-transmissive part 18 is offset. Therefore, to obtain a support 11 with good dimensional accuracy, it is preferable to use the post-firing method. When the conductive wires 14a and 14b are formed by post-firing, it is also possible to form a fine pattern by sputtering or vacuum vapor deposition by means of lift-off using photolithographic technology. Meanwhile, with co-firing, there is better adhesion between the ceramic plate and the conductive wires 14a and 14b, and another advantage is that the manufacturing cost is lower since the components are fired at the same time. Furthermore, the portion of the conductive wires 14a and 14b that is embedded in the support 11 may be formed by co-firing, after which the portion exposed on the upper surface and/or the lower surface may be formed by post-firing. Consequently, even though the conductive wires 14a and 14b are embedded in the support 11, dimensional accuracy can be ensured while keeping the manufacturing cost down. Also, with a co-firing method, punched-out green sheets can be stacked and fired, which makes it easy to form a cavity for accommodating the light emitting element 12, a protective element 16, or the like in the support 11.

Light Emitting Element 12

The light emitting element 12 is mounted on the conductive wires 14a and 14b formed on the support 11. It is preferable to use a light emitting diode as the light emitting element 12. Preferred examples of light emitting diodes include those in which a layered structure including a light emitting layer on a growth substrate has been formed using InN, AlN, GaN, InGaN, AlGaN, InGaAlN, and other such nitride semiconductors, group compound semiconductors, group II-VI compound semiconductors, and various other such semiconductors. The growth substrate can be sapphire or another such insulating substrate, SiC, GaN, GaAs, or another such conductive substrate, or the like. The light emitting element 12 has electrodes located to the inside of the outer edge of the light emitting element 12. There are no particular restrictions on the shape of the electrodes of the light emitting element 12, and the electrodes can be substantially rectangular, circular, or any of various other shapes. There are no particular restrictions on the material of the electrodes of the light emitting element 12, either. Nor are there any particular restrictions on the number of light emitting elements 12 mounted on the conductive wires 14a and 14b, and there may be just one element or two or more.

Joining Member

The joining member is used to join the light emitting element 12 on the conductive wires 14a and 14b formed on the support 11. The joining member is disposed at least between the light emitting element 12 and the conductive wires 14a and 14b. The material of the joining member can be one that allows to electricity conduct between the light emitting element 12 and the conductive wires 14a and 14b. Examples include Sn—Cu, Sn—Ag—Cu, Au—Sn, and other such solder materials, gold and other such metal bumps, and anisotropic conductive pastes.

The light emitting element 12 is supported by the joining member on the conductive wires 14a and 14b, so the lower surface of the semiconductor layer of the light emitting element 12 and the upper surface of the support 11 are separated by a distance that corresponds to the sum of the thickness of the joining member, the thickness of the electrodes of the light emitting element 12, and the thickness of the conductive wires exposed from the support upper surface. Accordingly, although there are no particular restrictions on the distance from the lower surface of the semiconductor layer of the light emitting element 12 to the upper surface of the support 11, shorter is better since the area separated from each other is covered by the phosphor layer 13 as shown in FIG. 2. More specifically, about between 6 and 200 μm is preferable.

Phosphor Layer 13

The phosphor layer 13 contains a fluorescent substance that is excited by the light emitted from the light emitting element 12 and emits light of a different wavelength from that of the light emitted by the light emitting element 12, and converts the light from the light emitting element 12 to a different wavelength. The phosphor layer 13 may convert the light from the light emitting element 12 to a shorter wavelength, but converting it to a longer wavelength is preferable from the standpoint of light extraction efficiency.

The phosphor layer 13 is provided so as to continuously cover at least the outer edge of the light emitting element 12 and the conductive wires 14a and 14b around the region where the light emitting element 12 is disposed. To obtain more uniform light emission, the upper and lateral side surfaces of the light emitting element 12 may also be covered by the phosphor layer 13.

The phosphor layer 13 is preferably formed in a uniform thickness (this encompasses a substantially uniform thickness). When the phosphor layer 13 is formed in a uniform thickness, less color unevenness due to variation in a thickness of the phosphor layer 13. There are no particular restrictions on the thickness of the phosphor layer 13, but the thicker the phosphor layer 13 is, the better, since it more readily covers between the pair of conductive wires 19 located on the lower side of the outer edge of the light emitting element. More specifically, about between 10 and 200 μm is preferable.

There are no particular restrictions on the fluorescent substance contained in the phosphor layer 13, as long as it is excited by light. Examples of the fluorescent substance preferably include at least one of;

nitride-based, oxynitride-based and sialon fluorescent substances activated mainly with lanthanoid elements such as cerium and europium;

alkaline earth metal halogen apatite fluorescent substances, alkaline earth metal borate halogen fluorescent substances, alkaline earth metal aluminate fluorescent substances, alkaline earth metal silicates, alkaline earth metal sulfides, alkaline earth metal thiogallate, alkaline earth metal silicon nitride, germanate salt fluorescent substances, which are activated mainly by lanthanoid elements such as europium, transition metal-based elements such as manganese;

rare earth aluminates fluorescent substances, rare earth silicate fluorescent substances, which are activated mainly with lanthanoid elements such as cerium;

organic and organic complexes, which are activated mainly with lanthanoid element such as europium.

Specific examples of the nitride-based fluorescent substance activated mainly with lanthanoid elements such as cerium and europium include $M2Si5N8:Eu$, $MAlSiN3:Eu$, $M2Si5N8:Eu$, $MSi7N10:Eu$, $M1.8Si5O0.2N8:Eu$, $M0.9Si7O0.1N10:Eu$, here, M is at least one of Sr, Ca, Ba, Mg and Zn.

Specific examples of the oxynitride-based fluorescent substance activated mainly with lanthanoid elements such as cerium and europium include $MSi2O2N2:Eu$.

Specific examples of the sialon fluorescent substances activated mainly with lanthanoid elements such as cerium and europium include $Mp/2Si12\text{-}p\text{-}qAlp+qOqN16\text{-}p:Ce$, M-Al—Si—O—N, here, q is 0 to 2.5, p is 1.5 to 3.

Specific examples of the alkaline earth metal halogen apatite fluorescent substances, which are activated mainly by lanthanoid elements such as europium, transition metal-based elements such as manganese include $M5(PO4)3X:R$, here, X is at least one of F, Cl, Br and I, and R is at least one of Eu, Mn, Eu and Mn.

Specific examples of the, alkaline earth metal borate halogen fluorescent substances include $M2B5O9X:R$.

Specific examples of the alkaline earth metal aluminate fluorescent include SrAl2O4:R, Sr4Al14O25:R, CaAl2O4:R, BaMg2Al16O27:R, BaMg2Al16O12:R, BaMgAl10O17:R.

Specific examples of the alkaline earth metal sulfides include La2O2S:Eu, Y2O2S:Eu, Gd2O2S:Eu.

Specific examples of the rare earth aluminates include YAG-based fluorescent substances such as Y3Al5O12:Ce, (Y0.8Gd0.2)3Al5O12:Ce, Y3(Al0.8Ga0.2)5O12:Ce, Y3(Al,Ga)5O12:Ce, (Y,Gd)3(Al,Ga)5O12:Ce, (Y,Gd)3(Al,Ga)5O12:Ce, (Y,Gd)3Al5O12:Ce, as well as Tb3Al5O12:Ce and Lu3Al5O12:Ce in which part or all of Y has been replaced with Tb, Lu or the like.

Specific examples of other fluorescent substances include ZnS:Eu, Zn2GeO4:Mn, MGa2S4:Eu, here, X is at least one of F, Cl, Br and I.

The above fluorescent substances may include a fluorescent substance which contain at least one of Tb, Cu, Ag, Au, Cr, Nd, Dy, Co, Ni and Ti instead of europium as necessary.

In addition to the fluorescent substances discussed above, any fluorescent substance having the same performance and effect can also be used.

Examples of a combination thereof include a combination of (Sr,Ca)5(PO4)3Cl:Eu (blue light emission), Lu3Al5O12:Ce (green light emission) or BaSi2O2N2:Eu (green to yellow light emission) and (Sr,Ca)2Si5N8:Eu (red light emission); a combination of Ca5(PO4)3Cl:Eu, Ca2B5O9Cl:Eu, BaMgAl10O17:Eu (blue light emission) and (Y,Gd)3Al5O12:Ce (yellow light emission); a combination of Ca5(PO4)3Cl:Eu, Ca2B5O9Cl:Eu, BaMg2Al16O27:Eu, or the like (blue light emission), Lu3AlO12:Ce (greed light emission) and (Sr,Ca)2Si5N8:Eu (red light emission). Accordingly, by combining the light emitted from the phosphor with the light emitted from the light source which has a peak emission wavelength between 360 and 470 nm of visible light in short wavelength range, white-base mixed color light having a good color rendering property can be obtained. Examples of a combination thereof include a combination of $Y_3Al_5O_{12}$: Ce (blue light emission) or $Y_3$(Al,Ga)5O12:Ce (blue light emission) and (Sr,Ca)SiN3: Eu (red light emission), a combination of Lu3AlO12:Ce (green light emission) and CaAlSiBaN3: Eu (red light emission). Thus, emission efficiency can be further improved by combining these phosphors with a light source having an emission peak wavelength near 450 nm (such as 400 to 460 nm).

There are no particular restrictions on the shape of the phosphor, but it is preferably spherical or has a similar shape. More specifically, an average particle size of 0.1 to 100 μm is preferable, and an average particle size of 1 to 10 μm is even more preferable.

The "average particle size of the phosphor" in the disclosure refers to the 50% particle size (volumetric standard) when the particle size distribution is measured using a Coulter Multisizer II (made by Coulter) by electric resistance method. The electric resistance method involves utilizing the correlation between particle size and electric resistance when a dispersed powder passes between electrodes, and in the case where the particles are stuck tightly together and it would be difficult to disperse them down to primary particles, then this method involves measuring the particle size of aggregated secondary particles.

As discussed above, with the light emitting device 100 according to Embodiment 1, of the distance between the pair of conductive wires located on the lower side of the light emitting element 12, the shortest distance is between the pair of conductive wires 19 located on the lower side of the outer edge of the light emitting element. Accordingly, of the space between the pair of conductive wires located on the lower side of the light emitting element, the space between the pair of conductive wires located on the lower side of the outer edge of the light emitting element, where mostly affects on uniform light emission, can be readily covered by the phosphor layer. It is therefore possible to obtain more uniform light emission.

Light Emitting Device 200 According to Embodiment 2

Figure 4:
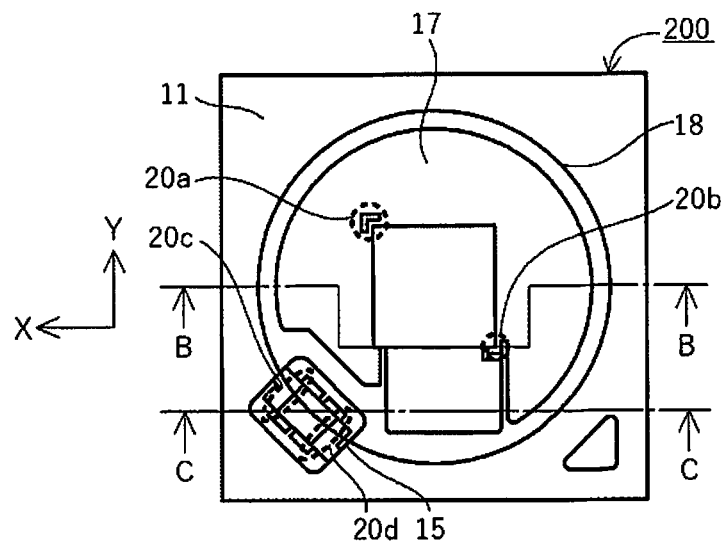
FIG. 4 is a schematic plan view of the light emitting device 200 according to Embodiment 2.
Figure 5:
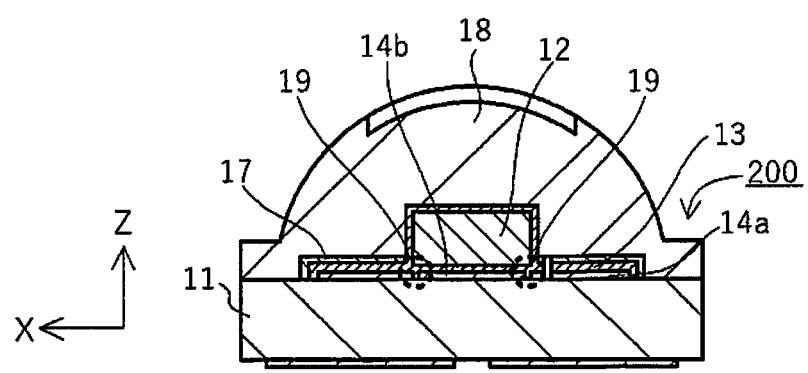
FIG. 5 is a schematic B-B cross section of FIG. 4.
Figure 6:
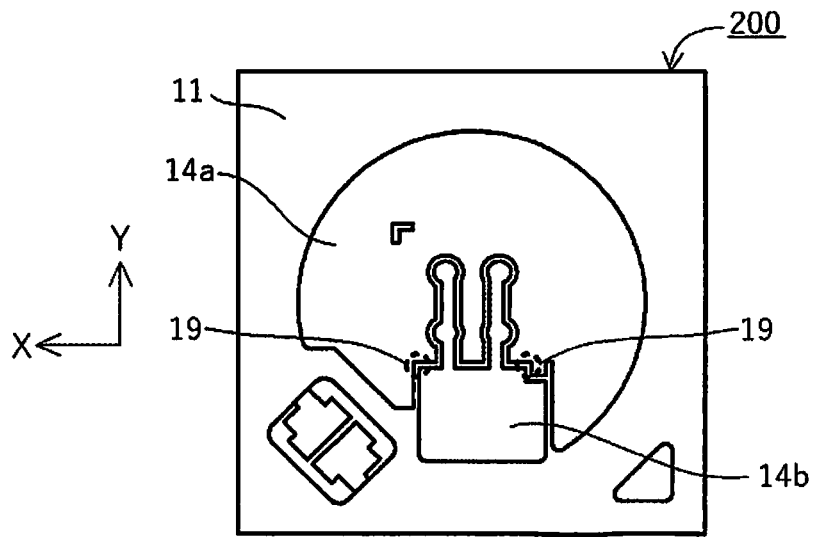
FIG. 6 is a schematic plan view of the conductive wires and the support in the light emitting device shown in FIG. 4.
Figure 7:
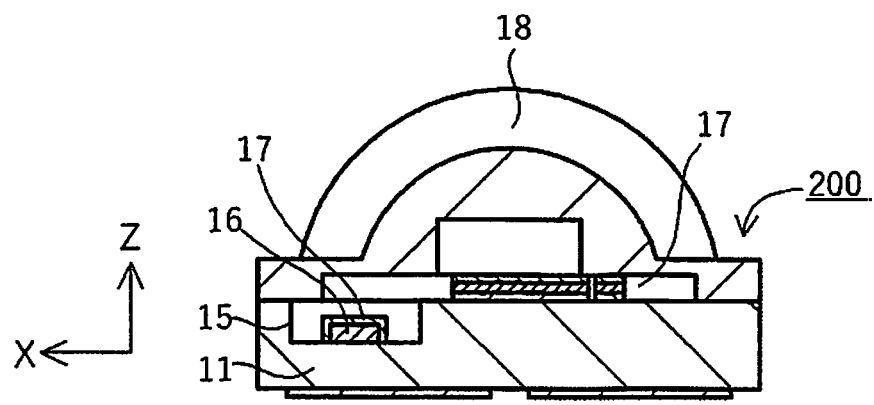
FIG. 7 is a schematic C-C cross section of FIG. 4.

FIG. 4 is a schematic plan view of the light emitting device 200 according to Embodiment 2. FIG. 5 is a B-B cross section of FIG. 4. FIG. 6 is a schematic plan view of the conductive wires and the support in the light emitting device shown in FIG. 4. FIG. 7 is a C-C cross section of FIG. 4. As shown in FIGS. 4 to 7, the light emitting device 200 according to Embodiment 2 differs from the light emitting device 100 according to Embodiment 1 in that it comprises a protective element 16, a light-reflective layer 17, and a light-transmissive part 18. The following description will focus on the differences from Embodiment 1.

The conductive wires 14a and 14b are preferably formed in a circular shape that centers on the light emitting element 12, as with the light emitting device 200 of Embodiment 2. Forming them in this way lowers the thermal resistance and allows the heat generated by the light emitting element 12 to be more efficiently dissipated through the conductive wires 14a and 14b. There are no particular restrictions on the shape, but "circular" here means that the arc is at least a semicircle.

Also, as shown in FIG. 4, the surface area of the light-reflective layer 17 (which has high reflectivity) at the lower part of the convex component of the light-transmissive part 18 is preferably greater than the surface area of the exposed support 11, because this increases the output. There are no particular restrictions on the surface area of the light-reflective layer 17 at the lower part of the convex component of the light-transmissive part 18, but preferably it is at least 1.5 times the surface area of the exposed support 11 at the lower part of the convex component of the light-transmissive part 18, and more preferably at least 2 times.

As shown in FIG. 6, in the case where the conductive wire 14a is formed in a circular shape in which the arc is at least a semicircle, the conductive wire 14b at the lower part of the light emitting element 12 is preferably formed in the same shape as the electrodes. This formation affords a larger surface area of the conductive wire 14a at the lower part of the light emitting element 12. Consequently, heat can be efficiently dissipated by the conductive wire 14a, which has low thermal resistance. There are no particular restrictions on the surface area of the conductive wire 14a at the lower part of the light emitting element 12, but it is preferably at least 5 times the surface area of the conductive wire 14b at the lower part of the light emitting element 12, and more preferably at least 8 times.

As shown in FIG. 4, recognition components 20a, 20b, 20c, and 20d may be provided, which serve as reference points when mounting the light emitting element 12, the protective element 16, and so forth on the conductive wires 14a and 14b. The recognition components 20a, 20b, 20c and 20d to be provided can be only one of them or plurality of them. There are no particular restrictions on the shape of the recognition components, as long as they allow for visual checking or image recognition, but they may be circular, triangular, T-shaped, or another such shape. For example, one of the recognition components may be L-shaped as the recognition component 20a or square as the recognition component 20b shown in FIG. 4. Also, as shown in FIG. 4, the recognition components 20a and 20b of the light emitting element 12 are preferably provided at diagonal corners of the light emitting element 12. Providing the recognition components 20a and 20b at diagonal corners of the element to be mounted makes it easier to recognize offset of the mounting position. With the protective element 16, the conductive wires 14a and 14b are formed to match the size of the protective element 16, creating the recognition components 20c and 20d. Forming the recognition components 20c and 20d to match the shape of the element to be mounted is preferable because it allows any offset of the mounting position to be easily recognized. There are no particular restrictions on the distance from the recognition components 20a, 20b, 20c, and 20d to the outer edge of the element to be recognized, but it is preferably between 0.02 and 3 mm.

Also, in the case where there are two or more pairs of conductive wires located on the lower side of the outer edge of the light emitting element 12, they may be positioned on the same side surface of the light emitting element 12. However, distance of spaces between the conductive wires are preferably long, rather than being closer together, so that the spaces between the conductive wires will be more readily covered by the phosphor layer 13.

There are no particular restrictions on the distance between a pair of conductive wires, but is preferably at least 0.2 mm. The distance between a pair of conductive wires is the length of the space between conductive wires located on the lower side on the outer edge of the light emitting element 12, sandwiched between a pair of conductive wires.

The support 11 may optionally have a cavity 15. Housing the light emitting element 12 and the protective element 16 in the cavity 15 reduces damage to the light emitting element 12 and the protective element 16, in the case where an external force is applied from the side surface, and also makes it easier to embed the light emitting element 12 and the protective element 16 in the light-transmissive part 18 discussed below. As shown in FIGS. 4 and 7, it is preferable for only the protective element 16 to be housed in the cavity 15 because this will reduce absorption of light from the light emitting element 12 by the protective element 16.

Protective Element 16

As discussed above, the protective element 16 may optionally be mounted on the conductive wires 14a and 14b. A Zener diode can be used, for example, as the protective element 16. As shown in FIGS. 4 and 7, the protective element 16 is preferably covered by the light-reflective layer 17 so that the light of the light emitting element 12 is not absorbed by the protective element 16.

Light-Reflective Layer 17

The light-reflective layer 17 may optionally cover the phosphor layer 13 formed on the conductive wires 14a and 14b. Since the light-reflective layer 17 is formed on the phosphor layer 13, even though the space between a pair of conductive wires located on the lower side on the outer edge of the light emitting element is not covered by the phosphor layer 13, parts not covered by the phosphor layer 13 can be covered by the light-reflective layer 17. This allows light to be emitted more uniformly since blue light emitted from the light emitting element do not cause phosphor excitation from being blocked by the light-reflective layer 17.

The light-reflective layer 17 is formed using a member capable of efficiently reflecting the light emitted from the light emitting element 12, or the light whose wavelength has been converted by the phosphor layer 13. More specifically, this layer is preferably formed from a member that reflects at least 70% of the light emitted from the light emitting element 12, or of the peak wavelength of light whose wavelength was converted by the phosphor layer 13, and more preferably a member that reflects at least 80%, and even more preferably a member that reflects at least 90%. Preferably the member less likely to transmit or absorb the light emitted from the light emitting element 12, or light whose wavelength has been converted by the phosphor layer 13. A material that has insulating properties is also preferable. Examples of such members with high reflectivity include $SiO_2$, $TiO_2$, $ZrO_2$, $BaSO_4$, and $MgO$. These members can be used singly or in combinations of two or more types.

There are no particular restrictions on the thickness of the light-reflective layer 17, but thicker is better than thinner because it allows for coverage of parts not covered by the phosphor layer 13. More specifically, a thickness of about 1 to 100 μm is preferable. Also, the thickness of the light-reflective layer is preferably 1 to 50% of the thickness of the light emitting element, and more preferably 3 to 35%.

Light-Transmissive Part 18

The phosphor layer 13 or the light-reflective layer 17 may optionally be covered by the light-transmissive part 18 in order to prevent peeling. The light-transmissive part 18 is formed using a member that transmits the light emitted from the light emitting element 12. More specifically, it is formed using a member that transmits at least 60% of the light emitted from the light emitting element 12, more preferably a member that transmits at least 70%, even more preferably a member that transmits at least 80%, and still more preferably a member that transmits at least 90%. Examples of such a member with high translucency include silicone resins, modified silicone resins, epoxy resins, phenol resins, polycarbonate resins, acrylic resins, trimethylpentene resins, polynorbornene resins, and hybrid resins that contain one or more of these resins. Also, in the case where the light-transmissive part 18 is given a lens function, the surface of the light-transmissive part 18 may be raised into a bullet shape or a convex lens shape.

Preferably, no light-transmissive material is disposed between the lower surface of the light emitting element 12 and the upper surfaces of the conductive wires 14a and 14b (i.e., between adjacent joining members), that is, there is preferably a void space there.

For the light-transmissive material composed of a resin material in particular, if the resin is filled at the lower part of the light emitting element 12, thermal stress produced during mounting or during operation of the light emitting device will cause the light-transmissive material to expand. Consequently, the joint strength ends up being weakened where the light emitting element 12 is joined to the conductive wires 14a and 14b. In the case where the joint strength weakens, there is the risk that the light emitting element 12 separates from the conductive wires 14a and 14b and does not light up.

In the case where the outer edge of the light emitting element 12 has parts that are not covered by the phosphor layer 13, the resin can intrude those parts, and tends to fill the lower part of the light emitting element 12. Accordingly, when the light-transmissive part 18 is formed of a resin material, the area around the outer edge of the light emitting element 12 tends to be covered by the phosphor layer 13, and this also lead to prevent the light emitting element 12 from non-lighting. Examples of the forming method of the light-transmissive part 18 include dispensing, printing, potting, casting, spin coating, transfer molding, and compression molding.

Method for Manufacturing Light Emitting Device 100 According to Embodiment 1

The method for manufacturing the light emitting device 100 according to Embodiment 1 will now be described.

First, a support 11 having conductive wires 14a and 14b is provided. The conductive wires 14a and 14b are such that when the light emitting element 12 is mounted, of the distance between the pair of conductive wires located on the lower side of the light emitting element 12, the distance between the pair of conductive wires 19 located on the lower side on the outer edge of the light emitting element is shortest.

Next, the light emitting element 12 is disposed on the conductive wires 14a and 14b, and joining members are used to join the light emitting element 12 to the conductive wires 14a and 14b. The joining method may be suitably selected as dictated by the type of joining member. For instance, the joining may be conducted out with ultrasonic waves, heat, load, light, a flux, or the like. Around the light emitting element 12, the conductive wires 14a and 14b are present in an exposed state, without being joined to the light emitting element 12. When a solder material is used as the joining member, these exposed conductive wires 14a and 14b have the effect of diverting away any surplus solder material not used in joining to the light emitting element 12 (that is, the surplus solder material moves from under the light emitting element 12 to the side of the exposed conductive wires 14a and 14b, and is joined to the exposed conductive wires 14a and 14b). Therefore, by providing these exposed conductive wires 14a and 14b, the light emitting element 12 can be joined to the conductive wires 14a and 14b with the proper amount of solder, and there will be fewer joint defects between the conductive wires 14a and 14b and the light emitting element 12 that are caused by an excessive amount of solder.

Next, a phosphor layer 13 is formed continuously covering the outer edge of the light emitting element 12 and the surfaces of the conductive wires 14a and 14b around the area where the light emitting element 12 is disposed. Electrodeposition and electrostatic coating are examples of methods for forming the phosphor layer 13. With electrodeposition and electrostatic coating, a conductive material is used at the place where the phosphor substance is to be deposited, which allows the phosphor layer 13 to be formed selectively in a uniform thickness on the support 11. Consequently, it is less likely that the thickness of the phosphor layer 13 will bring about color unevenness. When electrodeposition is employed, the phosphor layer 13 may be formed, for example, by placing the support 11 on which the light emitting element 12 has been mounted in a solution for electrodeposition containing phosphor particles, so that the phosphor particles are deposited on the surface of the light emitting element 12 and of the conductive wires 14a and 14b of the support 11 by electrophoresis in the solution. In the case where the surface of the light emitting element 12 is composed of a conductive material, the deposition of the phosphor particles on the surface of the light emitting element 12 can be accomplished, for example, by applying voltage to the light emitting element 12 itself, so that the charged phosphor particles move electrophoretically and are deposited on the surface of the light emitting element 12.

When a light emitting element 12 having a sapphire or other insulating substrate as the growth substrate is used, for example, the surface of the light emitting element 12 will have a non-conductive site (i.e., the portion of the growth substrate, etc.), and phosphor particles cannot be deposited at that site even though voltage is applied to the light emitting element 12 itself. In this case, for example, the phosphor particles can be deposited at the non-conductive site by providing a conductive cover layer to the non-conductive site, and then applying voltage to this cover layer. The cover layer can be composed of magnesium, aluminum, silicon, zirconium, lead, zinc, indium, tin, or the like.

Method for Manufacturing Light Emitting Device 200 According to Embodiment 2

The method for manufacturing the light emitting device 200 according to Embodiment 2 will now be described.

First, a support 11 having conductive wires 14a and 14b is prepared. Just as with the manufacturing method according to Embodiment 1, the conductive wires 14a and 14b are such that when the light emitting element 12 is mounted, of the distance between the pair of conductive wires located on the lower side of the light emitting element 12, the distance between the pair of conductive wires 19 located on the lower side on the outer edge of the light emitting element is shortest.

Next, the light emitting element 12 and the protective element 16 are disposed on the conductive wires 14a and 14b, and join the light emitting element 12 and the protective element 16 on the conductive wires 14a and 14b using joining members. The joining is accomplished in the same way as with the manufacturing method according to Embodiment 1, and will therefore not be described again.

Next, a phosphor layer 13 is formed on the support 11 so as to cover the light emitting element 12. The formation is accomplished in the same way as with the manufacturing method according to Embodiment 1, and will therefore not be described again.

Next, a light-reflective layer 17 is formed, which covers the phosphor layer 13 formed on the conductive wires 14a and 14b. Electrodeposition and electrostatic coating are preferable as the method for forming the light-reflective layer 17 as well as for forming the phosphor layer 13 as described in the manufacturing method according to Embodiment 1.

However, in the case where the light-reflective layer 17 is formed by electrodeposition, the reflective material is not formed on the surface of the light emitting element 12, unlike in the case of forming the phosphor layer 13 by electrodeposition. Accordingly, in the case of using a light emitting element 12 having a sapphire or other insulating substrate as the growth substrate, for example, the conductive cover layer provided to the non-conductive site before forming the phosphor layer 13 is removed, or it is modified to be insulating, after the formation of the phosphor layer 13. The following methods (1) to (3) are examples of how to accomplish this removal or modification. (1) After the phosphor layer 13 is formed, inputting a material that will selectively dissolve the material of the cover layer into the electrodeposition solution, which makes the electrodeposition solution into an acidic solution (such as hydrochloric acid or sulfuric acid) or an alkaline solution (such as sodium hydroxide or ammonia), and dissolving away the cover layer. (2) After the phosphor layer 13 is formed, taking the support 11 (including the light emitting element 12) out of the electrodeposition solution, then dipped in an acidic solution (such as hydrochloric acid or sulfuric acid) or an alkaline solution (such as sodium hydroxide or ammonia) to dissolve away the cover layer. (3) After the phosphor layer 13 is formed, modifying the cover layer to be insulating by an oxidation treatment or the like.

When method (1) or (2) is employed, it is preferable to use a cover layer composed of aluminum, zinc, or the like. When method (3) is employed, in addition to modifying the cover layer to have an insulating property, it is preferable to modify it into a member that is light-transmissive (and particularly one with high transmissive property). In this case, it is preferable to use a cover layer composed of magnesium, aluminum, silicon, zirconium, lead, or the like. As long as the above-mentioned treatment is possible, the thickness of the cover layer can be between 10 and 1,000 nm, for example.

In the case where the growth substrate of the light emitting element 12 is conductive, the light-reflective layer 17 can be prevented from being formed on the light emitting element 12 by forming an insulating cover layer after the phosphor layer 13 is formed. Examples of the material of the cover layer in this case include $Al_xO_y$ (1<x, 1<y), $SiO_x$ (1<x), and other such oxides, and methyl polymethacrylate, polyimide, silicone resin, and other such organic substances.

Next, a light-transmissive part 18 that covers the light emitting element 12, the protective element 16, the phosphor layer 13, and the light-reflective layer 17 is formed. Method of forming this is the same as with the manufacturing method according to Embodiment 1, and therefore will not be described again.

Embodiments were described above, but these are merely examples, and do not limit the configuration set forth in the Claims in any way.

INDUSTRIAL APPLICABILITY

An embodiment of the disclosure can be a light emitting device capable of moderating color unevenness, and can be utilized in a wide range of applications, such as various kinds of display devices, lighting fixtures, displays, light sources for liquid crystal display backlights, image readers (e.g., facsimile machines, copiers, and scanners), projector devices, and so forth.

What is claimed is:

1. A light emitting device comprising:
a light emitting element having electrodes,
a support,
at least one pair of conductive wires that are formed on a surface of the support, and on which the electrodes of the light emitting element are disposed, the pair of conductive wires being spaced apart from each other with a distance between the pair of conductive wires being non-constant under the light emitting element while the distance between the pair of conductive wires is the shortest in a region located under an outer edge of the light emitting element, and
a phosphor layer that continuously covers the outer edge of the light emitting element, and a surface of the conductive wires around a region where the light emitting element is disposed.

2. The light emitting device according to claim 1, wherein the distance between the pair of conductive wires in the region located under the outer edge of the light emitting element is between 0.02 and 0.04 mm.

3. The light emitting device according to claim 1, further comprising
a light-transmissive part that covers the phosphor layer.

4. The light emitting device according to claim 1, wherein the phosphor layer covers an upper surface and lateral side surfaces of the light emitting element.

5. The light emitting device according to claim 1, further comprising
a light-reflective layer that covers the phosphor layer formed on the conductive wires.

6. The light emitting device according to claim 1, wherein a thickness of the phosphor layer is between 10 and 200 μm.

7. A method for manufacturing the light emitting device comprising
providing a light emitting device having electrodes,
providing at least one pair of conductive wires on a surface of a support such that the pair of conductive wires are spaced apart from each other,
joining the electrodes of the light emitting device to the conductive wires such that a distance between the pair of conductive wires is non-constant under the light emitting element while the distance between the pair of conductive wires is the shortest in a region located under an outer edge of the light emitting element, and
forming a phosphor layer that continuously covers the outer edge of the light emitting element, and a surface of the conductive wires around a region where the light emitting element is disposed.

8. The method for manufacturing the light emitting device according to claim 7, further comprising
forming a light-transmissive layer that covers the phosphor layer.

9. The method for manufacturing the light emitting device according to claim 7, wherein
forming a light-reflective layer that covers the phosphor layer formed on the conductive wires.

10. The method for manufacturing the light emitting device according to claim 7, wherein
the forming the phosphor layer include the forming the phosphor layer by electrodeposition.

11. The method for manufacturing the light emitting device according to claim 7, wherein
the forming the light-reflective layer include the forming the light-reflective layer by electrodeposition.

* * * * *